US012363875B2

(12) United States Patent
King et al.

(10) Patent No.: US 12,363,875 B2
(45) Date of Patent: Jul. 15, 2025

(54) ELECTRONIC ASSEMBLY WITH ELECTROMAGNETIC SHIELDING

(71) Applicant: Deere & Company, Moline, IL (US)

(72) Inventors: Ryan J. King, West Fargo, ND (US); Trenton Mohl, Horace, ND (US)

(73) Assignee: DEERE & COMPANY, Moline, IL (US)

( * ) Notice: Subject to any disclaimer, the term of this patent is extended or adjusted under 35 U.S.C. 154(b) by 242 days.

(21) Appl. No.: 18/352,670

(22) Filed: Jul. 14, 2023

(65) Prior Publication Data

US 2024/0188266 A1 Jun. 6, 2024

Related U.S. Application Data

(60) Provisional application No. 63/386,014, filed on Dec. 5, 2022.

(51) Int. Cl.
*H05K 9/00* (2006.01)
*H05K 1/02* (2006.01)

(52) U.S. Cl.
CPC ......... *H05K 9/0084* (2013.01); *H05K 1/0203* (2013.01); *H05K 1/0228* (2013.01); *H05K 9/0032* (2013.01); *H05K 2201/10098* (2013.01); *H05K 2201/10984* (2013.01)

(58) Field of Classification Search
CPC .. H05K 9/0084; H05K 1/0203; H05K 1/0228; H05K 9/0032; H05K 2201/10098; H05K 2201/10984
See application file for complete search history.

(56) References Cited

U.S. PATENT DOCUMENTS

| 7,009,106 B2 | 3/2006 | Dipoala |
| 8,836,581 B2 | 9/2014 | Nysen |
| 8,943,460 B2 | 1/2015 | Huebl et al. |
| 9,048,539 B2 | 6/2015 | Yen |
| 11,228,114 B2 | 1/2022 | Tan |
| 2014/0192508 A1 | 7/2014 | Patil et al. |
| 2017/0220074 A1* | 8/2017 | Cooper ............... H05K 9/0032 |

(Continued)

FOREIGN PATENT DOCUMENTS

EP 3471525 A1 4/2019

OTHER PUBLICATIONS

EMC/EMI Shielding Explained, Mar. 2, 2020, pp. 1-5, [online]. Retrieved from the Internet <URL: https://www.mouser.com/blog/emc-emi-shielding-explained>.

(Continued)

*Primary Examiner* — Pete T Lee

(57) ABSTRACT

A walled structure surrounds a primary interference-generating component. The walled structure is configured to confine or shield substantially the electromagnetic interference within the one or more metallic walls or within a cavity formed by the one or more metallic walls and a metallic side of the first enclosure portion. A primary electrically conductive pedestal projects above a base of the first enclosure portion within the one or more metallic walls to facilitate contact between the primary electrically conductive pedestal and the primary interference-generating component to provide a viable or possible low impedance path to electrical ground for a portion of the electromagnetic interference within the one or more metallic walls.

18 Claims, 2 Drawing Sheets

(56) References Cited

U.S. PATENT DOCUMENTS

| | | |
|---|---|---|
| 2019/0208675 A1 | 7/2019 | Sabatier et al. |
| 2022/0201860 A1* | 6/2022 | Kim ...................... H05K 7/142 |
| 2023/0078536 A1* | 3/2023 | Ergun ..................... H01Q 1/36 |
| | | 361/783 |

OTHER PUBLICATIONS

Extended European Search Report and Written Opinion issued in European Patent Application No. 23207652.1, dated Apr. 8, 2024, in 06 pages.

* cited by examiner

ELECTRONIC ASSEMBLY WITH ELECTROMAGNETIC SHIELDING

RELATED APPLICATION

This application claims priority to U.S. provisional application No. 63/386,014, filed Dec. 5, 2022, where the above application is hereby incorporated by reference herein.

FIELD

The disclosure relates to an electronic assembly with electromagnetic shielding to reduce radio frequency interference to the electrical and electronic components of the electronic assembly.

BACKGROUND

In certain prior art, an electronic assembly may comprise a wireless communications device, such as wireless communications device for a cellular network. The wireless communications device may have components that emit radio frequency signals or microwave signals at a fundamental frequency, or at one or more harmonic frequencies, that could potentially interfere with other circuitry within the electronics assembly. Therefore, there is a need for an improved electronic assembly with electromagnetic shielding.

SUMMARY

An electromagnetic interference shield comprises one or more metallic walls, such as a walled structure of the first enclosure portion, where walled structure is electrically connected to one of said conductive traces on the circuit board. A primary interference-generating component on a side of the circuit board faces a first enclosure portion. The walled structure at least partially surrounds the primary interference-generating component; for example, the walled structure is configured to confine or shield substantially the electromagnetic interference within the one or more metallic walls or within a cavity formed by the one or more metallic walls and a metallic side of the first enclosure portion. A primary electrically conductive pedestal projects above a base of the first enclosure portion within the one or more metallic walls to facilitate contact between the primary electrically conductive pedestal and the primary interference-generating component (e.g., a case or ground terminal of the primary interference-generating component) to provide a viable or possible low impedance path to electrical ground for a portion of the electromagnetic interference within the one or more metallic walls.

BRIEF DESCRIPTION OF THE DRAWINGS

Like reference numbers in two or more drawings indicate like elements.

DETAILED DESCRIPTION

Figure 1:
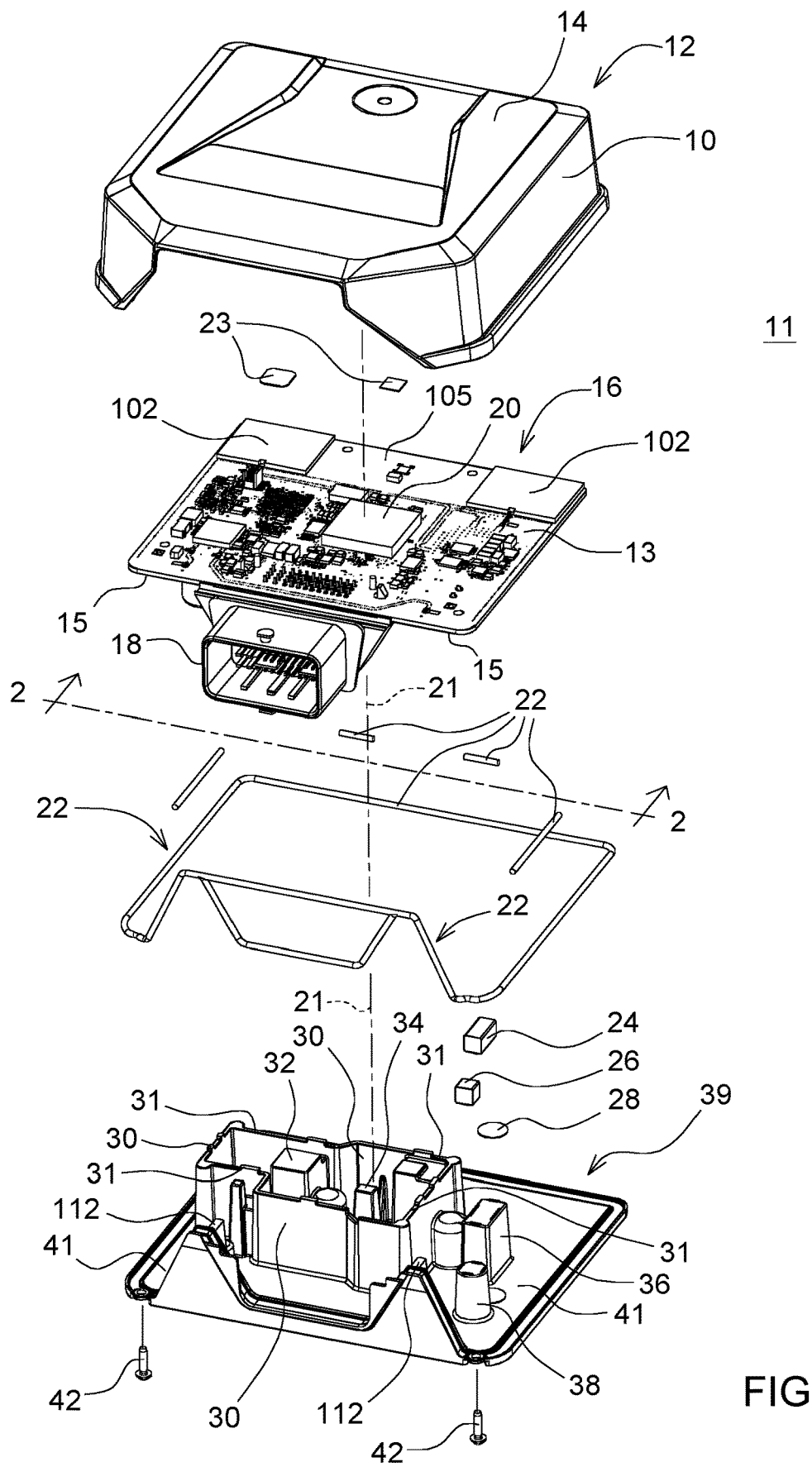
FIG. 1 is an exploded view of the electronic assembly.

In one embodiment, in FIG. 1 the electronic assembly 11 comprises a wireless communications device or telematics device with one or more wireless communication devices (e.g., wireless transceivers). The wireless communication device is coupled to or combined one or more internal antennas (e.g., 102), such as planar antennas or planar surface mount antennas that are spaced apart on one side of a circuit board 16 outside of a metallic wall or walled structure 30.

In one embodiment, a metallic walled structure 30 comprises one or more metallic walls that define or form a metallic electromagnetic shield (e.g., Faraday cage), alone, or together with one or more of the following: (a) an electrically conductive ground plane on one side (13 or 15) of the circuit board 16, or (b) an electrically conductive ground plane on one side (13 or 15) of the circuit board 16, where the conductive ground plane has a size and shape that covers the footprint or area within the interior defined by the walled structure 30, or (c) a first enclosure portion 39, such as an enclosure base, (d) a second enclosure portion 12, such as an enclosure lid, or (e) any combination of the above items. For example, the metallic electromagnetic shield may comprise an electromagnetic interference suppressor, an electromagnetic isolator, or both that reduces or ameliorates the electromagnetic interference (e.g., generated by one or more interference-generating components of the electronic assembly 11): (1) to circuitry within the electronic assembly 11 that is outside of the walled structure 30 or metallic electromagnetic field, and/or (2) to other electronic devices within propagational range (e.g., 0 meters to 400 meters from the electronic assembly 11) of the electromagnetic interference.

In one embodiment, the walled structure 30 may be configured in accordance with one or more configurations, which may be applied cumulatively or separately. Under a first configuration, an electrically conductive adhesive is disposed between a top of the one or more metallic walls (e.g., walled portion 30) and an interfacing side of the circuit board 16 to form an electrical connection and mechanical connection between the metallic wall and the conductive trace of the circuit board 16. Under a second configuration, the walled structure 30 (e.g., one or more metallic walls) terminate in one or more projections 31 (e.g., tabs, posts, bosses, or studs) that are spaced apart from each other along a perimeter and a top of the one or more metallic walls; each projection 31 is configured to align or register with a corresponding recess (e.g., slot, groove or channel), opening or a plated through-hole in the circuit board 16 that corresponds in shape and size to the respective projection.

In some embodiments, electronic assembly 11 comprises a housing or enclosure (12, 39), along with packaging of the circuit board 16, that supports efficient heat dissipation from one or more heat-generating components (e.g., 106, 108, 109), such as electronic data processors, wireless transceivers 108 or wireless modems, capacitors (e.g., 106), power transistors, power supplies, switching devices 109, or other components, which allows the electronic assembly 11 to run at elevated temperatures or otherwise suitable design temperatures for the components. Any electrical or electronic component (e.g., 106, 108, 109) may comprise a heat-generating component, an interference-generating component, or both, where any component may reside on, in, above, or below the circuit board 16 or in electrical or electromagnetic communication with the circuit board 16. For example, some of the heat-generating components (e.g., 106, 108, 109) may comprise heat-generating components and interference-generating components. Within the assembly, a metallic electromagnetic interference (EMI) comprises one or more metallic walls or metallic walled structure 30 and a metallic base that surrounds the power supply components 109 on the circuit board 16, such as switching devices 109 that operate at radio frequency (e.g., or sometimes microwave frequency switching rates when harmonics of the fundamental radio frequency interference are considered) that tend to produce electromagnetic noise or interference.

In some embodiments, the interference-generating components (e.g., 106, 108, 109) comprise any of the following: an electronic data processor, a microprocessor, a field-programmable-gate-array (FPGA) device, system-on-a chip (SOC), an integrated circuit, a microcontroller, an application-specific-integrated-circuit (ASIC) an oscillator, a transistor, a diode, switching device that is configured operate at a radio frequency, at a microwave frequency, or at fundamental frequency with harmonics of the fundamental frequency that tend to produce electromagnetic noise or interference. The heat-generating components comprise any of the following electronic devices: an electronic data processor, a microprocessor, a field-programmable-gate-array (FPGA) device, system-on-a chip (SOC), an integrated circuit, a microcontroller, an application-specific-integrated-circuit (ASIC) an oscillator, a transistor, a diode, a power switching device, a capacitor, or an electronic data processors, wireless transceivers, wireless modems, capacitors, power transistors, switching devices, or other components.

The electronic assembly 11 supports efficient heat dissipation from one or more heat-generating components, which allows the electronic assembly 11 to run at elevated temperatures or at suitable design temperatures. For example, a heat-generating component is located on the circuit board 16, the walled structure 30 (e.g., one or more metallic walls) is configured to dissipate heat from the heat-generating component to an exterior of the enclosure via the first enclosure portion 39. Further, the exterior of the enclosure is in thermal communication with an ambient air to dissipate thermal energy to the ambient air.

In one embodiment, a heat-generating component is mounted on, soldered to, or interfaces with the circuit board 16. The heat-generating component may comprise a primary heat generating component, a primary-interference generating component, or both. An electrically conductive pedestal (32, 34, 36, 38) is configured to project above a base of the first enclosure portion 39 within the one or more metallic walls to facilitate thermal communication, electrical communication, or both between the heat-generating component (e.g., primary heat-generating component) and the first enclosure portion 39.

A resilient interface member (24, 26; e.g., electrically and thermally conductive interface member) comprises any of the following: an electrically conductive foam interface member, an electrically and thermally conductive foam interface member, an electrically conductive elastomeric interface member, and an electrically and thermally elastomeric interface member. The resilient interface member (24, 26) is disposed between the heat-generating component (e.g., a portion of the case or a ground terminal of the heat-generating component) and an interfacing side or the pedestal (32, 34, 36, 38) of the first enclosure portion 39 to form an electrical connection and thermal communication path between the first enclosure portion 39 and the heat generating component. The electrically conductive foam interface members are commercially available and may comprise a flexible or (elastically, temporarily) deformable mesh of electrically conductive material around a resilient foam or elastomeric core.

Within the assembly, a metallic electromagnetic interference (EMI) shield, suppressor or reducer comprises a metallic wall and a metallic base that surrounds the power supply components on the circuit board 16, such as switching devices that operate at radio frequency (e.g., or sometimes microwave frequency switching rates when harmonics of the fundamental radio frequency interference are considered) that tend to produce electromagnetic noise or interference. A primary electrically conductive pedestal (32, 34) projects above a base of the first enclosure portion 39 within the one or more metallic walls to facilitate contact between the primary electrically conductive pedestal (32, 34) and the primary interference-generating component (e.g., a portion of the case or a ground terminal of the heat-generating component) to provide a viable or possible low impedance path to electrical ground for a portion of the electromagnetic interference within the one or more metallic walls.

In some embodiments, outside the one or more metallic walls a secondary electrically conductive pedestal (36, 38) is configured to project above a base of the first enclosure portion 39 to contact a secondary interference-generating component to provide a low impedance path to the ground for the electromagnetic interference outside the one or more metallic walls 30. Further, a secondary electrically and thermally conductive resilient interface member (24, 26; e.g., foam interface member) disposed to form an electrical and thermal communication path between the (secondary) interference-generating component and the secondary electrically conductive pedestal (36, 38) of the first enclosure portion 39 to ameliorate EMI and to manage and foster thermal dissipation from the secondary interference-generating component (106, 108; e.g., that may comprise a heat-generating component).

In certain embodiments, an electronic assembly 11 may comprise a wireless communications device, such as wireless communications device for a cellular network. In one embodiment, an electronic assembly 11 comprises a circuit board 16 having a conductive traces on a dielectric substrate. A first enclosure portion 39 is configured to mate with a second enclosure portion 12 to house the circuit board 16.

An antenna 102 is disposed on or above the circuit board 16. One or more wireless communication devices may be coupled to the antenna 102. The antenna 102 comprises a planar antenna that is on the circuit board 16 and spaced apart from the one or more metallic walls or walled structure 30. In one embodiment, an electrically conductive critical region 105 below the antenna 102 that provides a generally low impedance path to electrical ground for reduction of electromagnetic interference or coupling of electromagnetic interference between the antenna and other interference-generating components on the circuit board 16.

As indicated above, the electromagnetic interference shield comprises one or more metallic walls, such as a walled structure 30, of the first enclosure portion 39, alone or in combination with other conductive elements, such as a conductive ground plane or conductive (metallic plated, metal or alloy) first enclosure portion 39. In one embodiment, walled structure 30 is electrically connected, or both electrically and mechanically connected, to one of said conductive traces on the circuit board 16.

The foundation conductive trace (e.g., 104) may be configured in accordance with one or more examples, which may be applied cumulatively or separately. Under a first example, the conductive trace comprises a foundation conductive trace 104 on the circuit board 16 that: (a) corresponds to the perimeter of the one or more metallic walls 30 of the first enclosure portion 39 and (b) tracks the perimeter as a metallic strip or metallic footing that overlies a dielectric substrate of the circuit board 16, wherein the one or more metallic walls 30 are: (1) soldered to the foundation conductive trace 104 by solder, or (2) adhesively bonded to the foundation conductive trace 104 by a conductive adhesive, or (3) electrically connected and/or thermally communicating to the foundation conductive trace 104 via resilient interface members (24, 26), or (4) any combination of two or more items selected from the above items 1, 2 and 3. Further, one or more resilient interface members (24, 26) may be soldered or adhesively bonded to the foundation conductive trace 104 (and/or to the top of the walled structures 30) at target spacing (e.g., maximum on-center spacing intervals) to retain the one or more resilient interface members (24, 26) in proper alignment or registration (e.g., during assembly and thereafter during exposure to vibration during normal operation on a vehicle) with the walled structure 30 and the foundation conductive trace 104. In certain embodiments, the above-retained and above-aligned resilient interface members (24, 26) are well-suited to compensate for certain manufacturing tolerances and differences in the coefficients of thermal expansion between the walled structure 30 and the circuit board 16 (e.g., to reduce or ameliorate mechanical and/or thermal stress on the circuit board 16).

Under a second example, the conductive trace comprises a foundation conductive trace 104 on the circuit board 16 that: (a) corresponds to a perimeter of the one or more metallic walls 30 of the first enclosure portion 39, and (b) tracks and covers the interior or area within the walled structure 30 as continuous conductive ground plane or as a grid of conductive traces (e.g., bounded by the perimeter of the walled structure 30) comprising first conductive traces that are generally perpendicular to second conductive traces and that overlie a dielectric substrate of the circuit board 16, wherein the metallic walls (e.g., walled structure 30) are: (1) soldered to the foundation conductive trace 104 by solder, or (2) adhesively bonded to the conductive trace by a conductive adhesive, or (3) electrically connected and/or thermally communicating to the foundation conductive trace 104 via resilient interface members (24, 26), or (4) any combination of two or more items selected from the above items 1, 2 and 3. Further, one or more resilient interface members (24, 26) may be soldered or adhesively bonded to the foundation conductive trace 104 (and/or to the top of the walled structure 30) at target spacing (e.g., maximum on-center spacing intervals) to retain the one or more resilient interface members (24, 26) in proper alignment or registration (e.g., during assembly and thereafter during exposure to vibration during normal operation on a vehicle) with the walled structure 30 and the foundation conductive trace 104. In certain embodiments, the above-retained and above-aligned resilient interface members (24, 26) are well-suited to compensate for certain manufacturing tolerances and differences in the coefficients of thermal expansion between the walled structure 30 and the circuit board 16 (e.g., to reduce or ameliorate mechanical and/or thermal stress on the circuit board 16).

In one embodiment, a primary interference-generating component (e.g., 20, on a side of the circuit board 16 faces a first enclosure portion 39. The walled structure 30 surrounds the primary interference-generating component; the walled structure 30 is configured to confine or shield substantially the electromagnetic interference within the one or more metallic walls or within a cavity formed by the one or more metallic walls and a metallic side of the first enclosure portion 39. A primary electrically conductive pedestal (32, 34) projects above a base of the first enclosure portion 39 within the one or more metallic walls to facilitate contact between the primary electrically conductive pedestal (32, 34) and the primary interference-generating component (e.g., a portion of a case or metal case, or a portion of a ground terminal of the interference-generating component) to provide a viable or possible low impedance path to electrical ground for a portion of the electromagnetic interference within the one or more metallic walls.

In one example, a viable or possible low impedance path means a suitable impedance path for interference reduction/attenuation of an interfering signal or electromagnetic interference (EMI). Further, the impedance path refers to the combination of resistance (measurable in Ohms) and reactance (e.g., measured in Farads or Henries) that can provide a circuit path to ground (e.g., broadband passband, a frequency selective passband, or a rejection passband from the electrically conductive case or conductive pad of a component, ground lead of the component, or ground terminal of the component to ground) with minimal attenuation, such as within a target range of approximately zero decibel to approximately ten decibels of passband attenuation to reduce electromagnetic interference within the passband, although other target ranges may fall within the scope of the appended claims. Here, "approximately" means plus minus three decibels of signal strength, whereas elsewhere in this document "approximately," "generally," or "substantially" shall mean a tolerance, variation or range of plus or minus ten percent of any value, angle, geometric feature, electrical parameter, volume, mass or element unless otherwise explicitly noted in the specification.

With respect to the viable or possible low impedance path, the reactance can be modeled as capacitance reactance, or inductive reactance, or network of one or more capacitive elements, inductive elements, or both; where the network can comprise series combinations, parallel combinations of inductive elements and capacitive elements, or both. For example, any components (20, 106, 108, 109), such as interference-generating components or heat-generating components may be associated with stray capacitance (e.g., sometimes unexpected, unpredictable, or not designed for), or stray inductance (e.g., sometimes unexpected, unpredictable, or not designed for) that exists between parts of a circuit, such as leads, conductive traces on the circuit board 16, electrically conductive foam and metal contacts of the metallic pedestal (32, 34) and enclosure, chassis or case of the electronic assembly 11, and packaging of the components, among other things.

FIG. 1 illustrates an electronic assembly 11 that is exploded along vertical axis 21. A lower enclosure portion 39 mates with or can be combined or attached (e.g., via fasteners 42) with an upper enclosure portion 12 (with an enclosure top 14 and one or more enclosure side walls 10) to form an electronic assembly 11 that houses at least one circuit board 16. In some configurations, a gasket, sealant or seal 22 may provide an sealing interface between the upper enclosure portion 12 and the lower enclosure portion 39 to protect the circuit board 16 from dust, dirt, debris and moisture in the external environment, or on or within a vehicle that the electronic assembly 11 is mounted in. The electrical connector 18 supports an electrical connection, such as electrical power and data ports, of the electronic assembly 11 with other devices on vehicle network. In one illustrative example, an internal antenna 102 is disposed above a critical region of a lower enclosure portion 39 that comprises a metal or alloy enclosure, which can form a ground plane at a fixed or known spacing or separation to the antenna 102 (e.g., one or more planar antennas), or its or their antenna elements or radiators. Accordingly, the electrically conductive ground plane tends to provide a low impedance or low resistance path to ground for electromagnetic interference that might otherwise be coupled to the antenna 102, the circuit board 16, or components on the circuit board 16. For example, the electrically conductive ground plane is configured to support additional distributed return paths for the electromagnetic interference under the antenna 102.

In one embodiment, the lower enclosure portion 39 comprises a metallic base 41 with one or more central metallic walls 30 extending above the base 41, where one or more central metallic walls 30 and a metallic floor portion of the base 41 define an EMI shield (e.g., Faraday cage) that isolates noise-generating components (e.g., of the switching power supply 109) and components, heat-generating components, and/or interference-generating components. For example, any components, heat-generating components, and/or interference-generating components may comprise surface mounted electronic components on the circuit board 16 or electrical components, within the EMI shield or within its central walls 30. For example, the electromagnetic noise or potential electromagnetic interference (EMI) that is generated by the electrical components (e.g., power suppliers, radio frequency (RF) devices, or microwave devices) can be contained within the EMI shield to avoid or reduce: (a) electromagnetic interference with other components outside of the EMI shield on the same circuit board 16, or (b) electromagnetic interference with other electronic devices in possible electromagnetic interference propagation range (e.g., approximately zero (0) meters to approximately 400 meters or within the immediate vicinity) of the electronic assembly 11.

A mating side 15 of the circuit board 16 may comprise a wall-foundation, metallic circuit trace (104) that corresponds to the perimeter of the walls 30 and aligns or registers with the perimeter of the walls 30. In one embodiment, the wall-foundation, circuit trace 104 has recesses, openings or through-holes in the circuit board 16 that correspond with projections 31 (e.g., tabs, bosses, pins, posts, studs) on the top of one or more walls 30 that are spaced apart from each other. Each wall 30 may be soldered or attached to the wall-foundation metallic traces 104 via solder, via conductive adhesive, or via resilient interface members (24, 26), for example.

In certain configurations, the wall foundation, metallic traces 104 may have a set of (conductive) resilient interface members (24, 26; e.g., electrically conductive foam pads) overlying the wall foundation, metallic traces 104. In one embodiment, the resilient interface members (e.g., conductive foam pads) have a foam or resilient core that is surrounded by a movable mesh, braided, woven conductive cloth from conductive wires or stranded wires, for example. During manufacturing or assembly of the electronic assembly 11, resilient interface members (24, 26) can be placed by appropriate surface mount manufacturing machines at designated intervals or spatial separations on the wall-foundation metal traces 104 to provide a reliable thermal, electrical and mechanical connection between the foundation metal traces 104 and the metallic walls 30, and/or to provide a reliable thermal, electrical and mechanical connection between a regional zone of the circuit board 16 surrounding the foundation metal traces 104 and the metallic walls 30.

Figure 2:
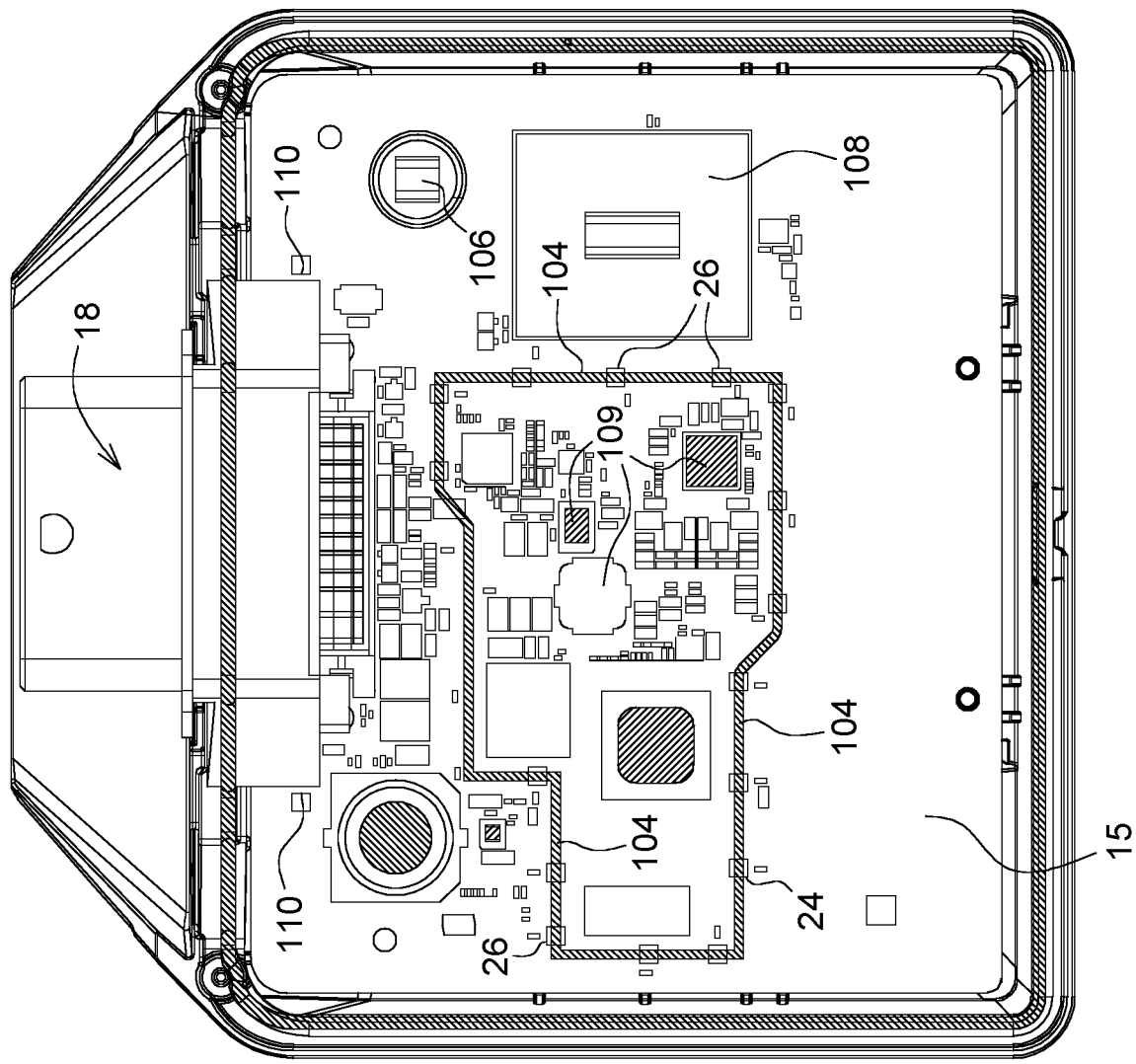
FIG. 2 is the lower side or lower-facing side of the circuit board as viewed from reference lines 2-2 in FIG. 1.

The first enclosure portion 39 (e.g., lower enclosure portion) has one or more projections that extend above the base 41 of the first enclosure portion 39. Some of the projections (32, 34, 36, 38) may be generally cylindrical, generally polyhedron, an obelisk, pillar, substantially cubical, a substantially rectangular block, or have other geometric shapes with planar top that thermally interfaces or that is in thermal communication with a heat-generating component (e.g., surface-mount (SMT) component, like SMT component 20, but on the lower side 15 of the circuit board 16 rather than the upper side of the circuit board 16) on the circuit board 16 to conduct or dissipate thermal energy from the heat-generating component (e.g., see FIG. 2) to the base 41, which can form a heat sink that dissipates heat to the ambient environment. The planar top may have a surface area or perimeter that is configured with a projection size and shape that is substantially similar to a mating size and shape of any corresponding heat-dissipating component or device (e.g., 106, 108, 109).

A thermal interface material (e.g., 23, 28), such as an elastomeric thermally conductive material, or conductive grease, or resilient interface member (e.g., thermally conductive foam pads) (24, 26) may be placed at the interface or gap between the heat-generating component (e.g., 20, 106, 108, 109) and the planar top of any projection or pedestal (e.g., of the enclosure) to facilitate efficient heat transfer or thermal energy from the heat-generating component to the lower enclosure portion 39; hence, to the ambient environment form the exterior of the electronic assembly 11 and its electronic enclosure. The resilient interface member (24, 26) or conductive foam pads (e.g., 24, 26) may be thermally conductive, electrically conductive, or both. For example, at the interface or gap between the heat-generating component (e.g., 20, 106, 108, 109) and the planar top of any projection or pedestal (e.g., of the enclosure), a resilient interface member (e.g., thermally conductive foam pads) (24, 26) may be adhesively bonded (e.g., to the projection or pedestal) to facilitate efficient heat transfer or thermal energy from the heat-generating component to the lower enclosure portion 39.

In an alternate embodiment, the resilient interface member may comprise a surface-mounted spring, such as a metal spring clip having a base portion and a lever portion that is cantilevered from the base portion, where the base portion is soldered to a ground pad on the circuit board 16 or adhesively bonded to a portion of a circuit board, component, or enclosure (e.g., pedestal of the enclosure).

In some configurations, an outer surface of the base 41 or lower enclosure portion 39 is finned, whereas in other configurations the base 41 or lower enclosure portion 39 has a generally planar outer surface. In an alternate embodiment, the outer surface or the base 41 or lower enclosure portion 39 has channels for conducting a coolant to a radiator or heat exchanger via tubes or conductors.

In some configurations, the side (e.g., lower side or lower-facing side 15) of the circuit board 16 with the wall-foundation metal traces 104 has conductive pads mounted on the circuit board 16. Further, in certain embodiments, the wall-foundation metal traces comprise a ground plane on either side (13, 15) of the circuit board 16 or a grid of conductive strips on either side (13, 15) of the circuit board 16. The wall-foundation metallic traces, or the walled structure 30, or its projections may be coupled electrically and mechanically (e.g., via metallic plated through-holes or conductive through-holes, or blind through-holes, or slots or grooves in the circuit board 16 or its dielectric layer, its metallic layer or both) to the ground plane or ground conductive traces on an opposite side (e.g., upper side or upper-facing side 13) of the circuit board 16.

The resilient interface members (24, 26; e.g., conductive pads) interface with supplemental grounding projections that extend above the base 41 portion of the lower enclosure. Additional electrical connections can be formed between the grounding projections (e.g., metallic obelisks or pedestal (32, 34, 112) and the conductive pads 110, directly or indirectly via conductive foam pads or thermal interface material. For example, at the interface or gap between a component (e.g., 20, 106, 108, 109) and the planar top of any projection or pedestal (e.g., of the enclosure), a resilient interface member (e.g., thermally conductive foam pads) (24, 26) may be soldered, or conductively adhesively bonded (e.g., to the projection or pedestal) to facilitate a low impedance path (and/or thermal communication) between component (e.g., interference-generating component) and the enclosure (e.g., lower enclosure portion 39). One or more of the above addition electrical connections provide a low impedance return path to ground to reduce or attenuate electromagnetic interference or radiation that would otherwise disturb or have greater amplitude with respect to components outside of the metallic walls 30 (e.g., Faraday cage), such as the wireless modem or wireless communications (system) device (e.g., system on chip or other semiconductor device). To suppress or attenuate EMI in a reliable manner, the one or more walls 30 are grounded to electrical ground (e.g., chassis ground). Further, the walls 30 can be connected to electrical ground through one more ground electrical connections (e.g., via electrically conductive foam pads 24, 26, via solder, and/or via conductive adhesive) to the wall-foundation metallic trace 104 which is at ground potential or connected to a ground plane of the circuit board 16.

The electronic assembly 11 is well-suited for meeting regulatory requirements for the electronic assembly 11, such as wireless standards requiring certification or compliance with homologation requirements in certain jurisdictions.

Although certain embodiments of electronic assemblies, wireless devices (e.g., receivers, transceivers), systems, methods, processes and examples have been described in this disclosure, the scope of the coverage of this disclosure may extend to variants of the receiver, systems, methods, processes, examples and systems and concepts disclosed herein. For example, in any patent that may be granted on this disclosure, one or more claims can cover equivalents and variants to the full extent permitted under applicable law, among other things.

The invention claimed is:

1. An electronic assembly comprising:
   a circuit board having a conductive traces on a dielectric substrate;
   an first enclosure portion configured to mate with a second enclosure portion to house the circuit board;
   an antenna on or above the circuit board;
   an electromagnetic interference shield comprising one or more metallic walls of the first enclosure portion, where the one or more metallic walls are electrically connected to one of said conductive traces on the circuit board;
   a primary interference-generating component on a side of the circuit board facing a first enclosure portion, the one or more metallic walls surrounding the primary interference-generating component, the one or more metallic walls configured to confine or shield substantially the electromagnetic interference within the one or more metallic walls or within a cavity formed by the one or more metallic walls a metallic side of the first enclosure portion; and
   a primary electrically conductive pedestal that projects above a base of the first enclosure portion within the one or more metallic walls to facilitate contact between the primary electrically conductive pedestal and the primary interference-generating component to provide a possible low impedance path to electrical ground for a portion of the electromagnetic interference confined within the one or more metallic walls.

2. The electronic assembly according to claim 1 wherein the antenna comprises a planar antenna that is on the circuit board and spaced apart from the one or more metallic walls.

3. The electronic assembly according to claim 1 further comprising
   an electrically conductive adhesive or a resilient interface member is disposed between a top of the one or more metallic walls and an interfacing side of the circuit board to form an electrical connection and mechanical connection between the metallic wall and the conductive trace of the circuit board.

4. The electronic assembly according to claim 1 wherein the one or more metallic walls terminate in one or more projections that are spaced apart from each other along a perimeter and a top of the one or more metallic walls, each projection is configured to align or register with a recess, opening or a plated through-hole in the circuit board that corresponds in shape and size to the respective projection.

5. The electronic assembly according to claim 4 wherein said conductive trace comprises a foundation conductive trace as a metallic strip on the circuit board that corresponds to the perimeter of the one or more metallic walls of the first enclosure portion, wherein the one or more metallic walls are soldered to the foundation conductive trace by solder, or adhesively bonded to the foundation conductive trace by a conductive adhesive, or electrically connected to the foundation trace by a resilient interface member.

6. The electronic assembly according to claim 1 wherein the conductive trace comprises a foundation conductive trace as a conductive grid on the circuit board that is bounded by to a perimeter of the one or more metallic walls of the first enclosure portion, wherein the metallic walls are soldered to the foundation conductive trace by solder, or adhesively bonded to the conductive trace by a conductive adhesive, or electrically connected to the foundation trace by a resilient interface member.

7. The electronic assembly according to claim 1 wherein the first enclosure portion comprises an electrically conductive critical region below the antenna that provides a generally low impedance path to electrical ground for reduction of electromagnetic interference or coupling of electromagnetic interference between the antenna and other interference-generating components on the circuit board.

8. The electronic assembly according to claim 1 wherein a heat-generating component is located on the circuit board, the one or more metallic walls is configured to dissipate heat from the heat-generating component to an exterior of the enclosure via the first enclosure portion.

9. The electronic assembly according to claim 8 wherein the exterior of the enclosure is in thermal communication with an ambient air to dissipate thermal energy to the ambient air.

10. The electronic assembly according to claim 1 further comprising:
    a heat-generating component on the circuit board,
    an electrically conductive pedestal that projects above a base of the first enclosure portion within the one or more metallic walls to facilitate thermal communication between the heat-generating component and the first enclosure portion;
    a resilient interface member disposed between the heat-generating component and an interfacing side or the pedestal of the first enclosure portion to form an electrical connection and thermal communication path between the first enclosure portion and the heat-generating component.

11. The electronic assembly according to claim 1 further comprising:
a secondary electrically conductive pedestal that projects above a base of the first enclosure portion outside the one or more metallic walls to contact a secondary interference-generating component to provide a low impedance path to the ground for the electromagnetic interference outside the one or more metallic walls.

12. The electronic assembly according to claim 11 further comprising:
a resilient interface member disposed to form an electrical and thermal communication path between the interference-generating component and the secondary electrically conductive pedestal of the first enclosure portion.

13. The electronic assembly according to claim 1 wherein the antenna is coupled to a wireless communications device.

14. The electronic assembly according to claim 1 wherein the interference-generating components comprise any of the following: a switching device that is configured operate at a radio frequency, at a microwave frequency, or at fundamental frequency with harmonics of the fundamental frequency that tend to produce electromagnetic noise or interference.

15. The electronic assembly according to claim 1 wherein the heat-generating components comprise any of the following electronic devices: a power switching device, a capacitor, or an electronic data processor.

16. The electronic assembly according to claim 1 further comprising:
a heat-generating component on the circuit board,
an electrically conductive pedestal that projects above a base of the first enclosure portion within the one or more metallic walls to facilitate thermal communication between the heat-generating component and the first enclosure portion;
an electrically and thermally conductive foam interface member disposed between the heat-generating component and an interfacing side or the pedestal of the first enclosure portion to form an electrical connection and thermal communication path between the first enclosure portion and the heat-generating component.

17. The electronic assembly according to claim 1 further comprising:
a secondary electrically conductive pedestal that projects above a base of the first enclosure portion outside the one or more metallic walls to contact a secondary interference-generating component to provide a low impedance path to the ground for the electromagnetic interference outside the one or more metallic walls.

18. The electronic assembly according to claim 17 further comprising:
a secondary electrically and thermally conductive foam interface member disposed to form an electrical and thermal communication path between the interference-generating component and the secondary electrically conductive pedestal of the first enclosure portion.

* * * * *